(12) United States Patent
Wu

(10) Patent No.: US 8,306,245 B2
(45) Date of Patent: Nov. 6, 2012

(54) MULTI-MODE AUDIO AMPLIFIERS

(75) Inventor: Zining Wu, Los Altos, CA (US)

(73) Assignee: Marvell World Trade Ltd., St. Michael (BB)

( * ) Notice: Subject to any disclaimer, the term of this patent is extended or adjusted under 35 U.S.C. 154(b) by 1187 days.

(21) Appl. No.: 12/125,448

(22) Filed: May 22, 2008

(65) Prior Publication Data

US 2008/0292116 A1    Nov. 27, 2008

Related U.S. Application Data

(60) Provisional application No. 60/952,760, filed on Jul. 30, 2007, provisional application No. 60/940,223, filed on May 25, 2007.

(51) Int. Cl.
*H03F 99/00*    (2009.01)

(52) U.S. Cl. ........................................ 381/120; 375/238

(58) Field of Classification Search .................. 381/120; 375/238

See application file for complete search history.

(56) References Cited

U.S. PATENT DOCUMENTS

| | | | |
|---|---|---|---|
| 4,368,435 A * | 1/1983 | Bloy | 330/133 |
| 6,430,220 B1 * | 8/2002 | Determan | 375/238 |
| 7,080,108 B1 | 7/2006 | Acharya | |
| 2005/0100082 A1 * | 5/2005 | Ma | 375/148 |
| 2005/0147179 A1 | 7/2005 | Paoli et al. | |
| 2006/0109939 A1 | 5/2006 | Ciccarelli et al. | |
| 2007/0052556 A1 | 3/2007 | Janssen et al. | |
| 2008/0143436 A1 * | 6/2008 | Xu | 330/10 |

FOREIGN PATENT DOCUMENTS

EP    1727294    11/2006

OTHER PUBLICATIONS

International Search Report dated Jan. 14, 2009 for corresponding PCT/US2008/064685.

* cited by examiner

*Primary Examiner* — Steven J Fulk

(57) ABSTRACT

A multimode audio amplifier comprises: a mode controller adapted to provide a control signal; and at least one multimode module, wherein each of the multimode modules has a plurality of operating modes, wherein the operating modes are selected in accordance with the control signal, wherein changing the operating modes results in a measurable change in at least one characteristic of the multimode audio amplifier; wherein the characteristics of the multimode audio amplifier consist of signal to noise ratio (SNR); total harmonic distortion and noise (THD+N); input to output delay; power consumption; and efficiency.

26 Claims, 8 Drawing Sheets

MULTI-MODE AUDIO AMPLIFIERS

CROSS-REFERENCE TO RELATED APPLICATIONS

This application claims the benefit of U.S. Provisional Patent Application Ser. No. 60/940,223, filed on May 25, 2007 and U.S. Provisional Patent Application Ser. No. 60/952,760, filed Jul. 30, 2007, the disclosures thereof incorporated by reference herein in their entirety.

BACKGROUND

The present invention relates generally to signal processing. More particularly, the present invention relates to multimode audio amplifiers.

SUMMARY

In general, in one aspect, an embodiment features a multimode audio amplifier comprising: a mode controller adapted to provide a control signal; and at least one multimode module, wherein each of the multimode modules has a plurality of operating modes, wherein the operating modes are selected in accordance with the control signal, wherein changing the operating modes results in a measurable change in at least one characteristic of the multimode audio amplifier; wherein the characteristics of the multimode audio amplifier consist of signal to noise ratio (SNR); total harmonic distortion and noise (THD+N); input to output delay; power consumption; and efficiency.

Embodiments of the amplifier can include one or more of the following features. In some embodiments, the at least one multimode module includes at least one of: an equalizer; a sampling module; a noise shaper; a pulse width modulator; and an analog output module. Some embodiments comprise a portable device comprising the amplifier. Some embodiments comprise a mobile telephone comprising the amplifier. Some embodiments comprise a variable-length finite impulse response (FIR) filter adapted to provide an output signal based on an input signal, wherein a length of the variable-length FIR filter is selected in accordance with the control signal, wherein the length of the variable-length FIR filter represents at least one of an order of the variable-length FIR filter, and a number of taps of the variable-length FIR filter.

In general, in one aspect, an embodiment features a multimode audio amplifier comprising: means for providing a control signal; and at least one multimode module means for operating in a plurality of modes, wherein each of the module means has a plurality of the modes, wherein the modes are selected in accordance with the control signal, wherein changing the modes results in a measurable change in at least one characteristic of the multimode audio amplifier; wherein the characteristics of the multimode audio amplifier consist of signal to noise ratio (SNR); total harmonic distortion and noise (THD+N); input to output delay; power consumption; and efficiency.

Embodiments of the amplifier can include one or more of the following features. In some embodiments, the at least one multimode module means includes at least one of: an equalizer; a sampling module; a noise shaper; a pulse width modulator; and an analog output module. Some embodiments comprise a portable device comprising the amplifier. Some embodiments comprise a mobile telephone comprising the amplifier. Some embodiments comprise filter means for providing an output signal based on an input signal, wherein a length of the filter means is selected in accordance with the control signal, wherein the length of the filter means represents at least one of an order of the filter means, and a number of taps of the filter means.

In general, in one aspect, an embodiment features a method comprising: receiving a control signal; and operating at least one multimode module of a multimode audio amplifier in a plurality of modes, wherein each of the modules has a plurality of the modes, wherein the modes are selected in accordance with the control signal, wherein changing the modes results in a measurable change in at least one characteristic of the multimode audio amplifier; wherein the characteristics of the multimode audio amplifier consist of signal to noise ratio (SNR); total harmonic distortion and noise (THD+N); input to output delay; power consumption; and efficiency.

Embodiments of the method can include one or more of the following features. In some embodiments, the at least one multimode module includes at least one of: an equalizer; a sampling module; a noise shaper; a pulse width modulator; and an analog output module. Some embodiments comprise providing a FIR filter; selecting a length of the FIR filter in accordance with the control signal, wherein the length of the filter means represents at least one of an order of the FIR filter, and a number of taps of the FIR filter.

In general, in one aspect, an embodiment features a computer program executable on a processor, comprising: instructions for receiving a control signal; and instructions for operating at least one multimode module of a multimode audio amplifier in a plurality of modes, wherein each of the modules has a plurality of the modes, wherein the modes are selected in accordance with the control signal, wherein changing the modes results in a measurable change in at least one characteristic of the multimode audio amplifier; wherein the characteristics of the multimode audio amplifier consist of signal to noise ratio (SNR); total harmonic distortion and noise (THD+N); input to output delay; power consumption; and efficiency.

Embodiments of the computer program can include one or more of the following features. In some embodiments, the at least one multimode module includes at least one of: an equalizer; a sampling module; a noise shaper; a pulse width modulator; and an analog output module. Some embodiments comprise providing a FIR filter; selecting a length of the FIR filter in accordance with the control signal, wherein the length of the filter means represents at least one of an order of the FIR filter, and a number of taps of the FIR filter.

In general, in one aspect, an embodiment features an apparatus comprising: a filter controller adapted to provide a control signal; and a variable-length finite impulse response (FIR) filter adapted to provide an output signal based on an input signal, wherein a length of the variable-length FIR filter is selected in accordance with the control signal, wherein the length of the variable-length FIR filter represents at least one of an order of the variable-length FIR filter, and a number of taps of the variable-length FIR filter.

Embodiments of the apparatus can include one or more of the following features. In some embodiments, the variable-length FIR filter comprises: a plurality of fixed-length FIR filters, wherein each of the fixed-length FIR filters is adapted to provide a respective filtered signal based on the input signal, and further wherein each of the fixed-length FIR filters has a different length; and an output module adapted to provide one of the filtered signals as the output signal in accordance with the control signal. In some embodiments, the variable-length FIR filter comprises: a first fixed-length FIR filter adapted to provide a first filtered signal based on the input signal; a second fixed-length FIR filter adapted to provide a second filtered signal based on the first filtered signal;

and an output module adapted to provide one of the first and second filtered signals as the output signal in accordance with the control signal. In some embodiments, the filter controller provides the control signal based on at least one of a characteristic of the input signal, and a battery level of a battery providing power to the variable-length FIR filter. In some embodiments, the characteristic of the input signal comprises at least one of: a type of the input signal; and a bandwidth of the input signal. In some embodiments, the type of the input signal comprises at least one of: voice; and music. Some embodiments comprise an amplifier comprising the apparatus. Some embodiments comprise at least one multimode module, wherein each of the multimode modules has a plurality of operating modes, and wherein the operating modes are selected in accordance with the control signal. In some embodiments, the at least one multimode module includes at least one of: an equalizer; a sampling module; a noise shaper; a pulse width modulator; and an analog output module. Some embodiments comprise a portable device comprising the amplifier. Some embodiments comprise a mobile telephone comprising the amplifier.

In general, in one aspect, an embodiment features an apparatus comprising: filter controller means for providing a control signal; and filter means for providing an output signal based on an input signal, wherein a length of the filter means is selected in accordance with the control signal, wherein the length of the filter means represents at least one of an order of the filter means, and a number of taps of the filter means.

Embodiments of the apparatus can include one or more of the following features. In some embodiments, the filter means comprises: a plurality of filters means for providing a respective filtered signal based on the input signal, wherein each of the filter means has a different length; and output means for providing one of the filtered signals as the output signal in accordance with the control signal. In some embodiments, the filter means comprises: first filter means for providing a first filtered signal based on the input signal; second filter means for providing a second filtered signal based on the first filtered signal; and output means for providing one of the first and second filtered signals as the output signal in accordance with the control signal. In some embodiments, the filter controller means provides the control signal based on at least one of a characteristic of the input signal, and a battery level of a battery providing power to the filter means. In some embodiments, the characteristic of the input signal comprises at least one of: a type of the input signal; and a bandwidth of the input signal. In some embodiments, the type of the input signal comprises at least one of: voice; and music. Some embodiments comprise an amplifier comprising the apparatus. Some embodiments comprise at least one multimode module means for operating in a plurality of modes, wherein each of the module means has a plurality of operating modes, wherein the operating modes are selected in accordance with the control signal, wherein changing the operating modes results in a measurable change in at least one characteristic of the multimode audio amplifier. In some embodiments, the at least one multimode module means includes at least one of: means for equalizing; means for sampling; means for shaping noise; means for pulse width modulating; and means for analog outputting. Some embodiments comprise a portable device comprising the amplifier. Some embodiments comprise a mobile telephone comprising the amplifier.

In general, in one aspect, an embodiment features a method comprising: receiving a control signal; and providing an output signal based on an input signal, including filtering the input signal with a variable-length FIR filter, wherein a length of the variable-length FIR filter is selected in accordance with the control signal, wherein the length of the variable-length FIR filter represents at least one of an order of the variable-length FIR filter, and a number of taps of the variable-length FIR filter.

Embodiments of the method can include one or more of the following features. In some embodiments, filtering the input signal with the variable-length FIR filter comprises: providing the input signal to a plurality of fixed-length FIR filters, wherein each of the fixed-length FIR filters provides a respective filtered signal based on the input signal, wherein each of the fixed-length FIR filters has a different length; and providing one of the filtered signals as the output signal in accordance with the control signal. In some embodiments, filtering the input signal with the variable-length FIR filter comprises: providing the input signal to a first fixed-length FIR filter, wherein the first fixed-length FIR filter provides a first filtered signal based on the input signal; providing the first filtered signal to a second fixed-length FIR filter, wherein the second fixed-length FIR filter provides a second filtered signal based on the first filtered signal; and providing one of the first and second filtered signals as the output signal in accordance with the control signal. Some embodiments comprise providing the control signal based on at least one of a characteristic of the input signal, and a battery level of a battery providing power to the variable-length FIR filter. In some embodiments, the characteristic of the input signal comprises at least one of: a type of the input signal; and a bandwidth of the input signal. In some embodiments, the type of the input signal comprises at least one of: voice; and music. Some embodiments comprise providing the control signal to at least one multimode module, wherein each of the multimode modules has a plurality of operating modes, and wherein the operating modes are selected in accordance with the control signal. In some embodiments, the at least one multimode module includes at least one of: an equalizer; a sampling module; a noise shaper; a pulse width modulator; and an analog output module.

In general, in one aspect, an embodiment features a computer program executable on a processor, comprising: instructions for receiving a control signal; and instructions for providing an output signal based on an input signal, including filtering the input signal with a variable-length FIR filter, wherein a length of the variable-length FIR filter is selected in accordance with the control signal, wherein the length of the variable-length FIR filter represents at least one of an order of the variable-length FIR filter, and a number of taps of the variable-length FIR filter.

Embodiments of the computer program can include one or more of the following features. In some embodiments, the instructions for filtering the input signal with the variable-length FIR filter comprises: instructions for providing the input signal to a plurality of fixed-length FIR filters, wherein each of the fixed-length FIR filters provides a respective filtered signal based on the input signal, wherein each of the fixed-length FIR filters has a different length; and instructions for providing one of the filtered signals as the output signal in accordance with the control signal. In some embodiments, the instructions for filtering the input signal with the variable-length FIR filter comprises: instructions for providing the input signal to a first fixed-length FIR filter, wherein the first fixed-length FIR filter provides a first filtered signal based on the input signal; instructions for providing the first filtered signal to a second fixed-length FIR filter, wherein the second fixed-length FIR filter provides a second filtered signal based on the first filtered signal; and instructions for providing one of the first and second filtered signals as the output signal in accordance with the control signal. Some embodiments comprise instructions for providing the control signal based on at least one of a characteristic of the input signal, and a battery level of a battery providing power to the variable-length FIR filter. In some embodiments, the characteristic of the input signal comprises at least one of: a type of the input signal; and a bandwidth of the input signal. In some embodiments, the type of the input signal comprises at least one of: voice; and music. Some embodiments comprise instructions for providing the control signal to at least one multimode module, wherein each of the multimode modules has a plurality of operating modes, and wherein the operating modes are selected in accordance with the control signal. In some embodiments, the at least one multimode module includes at least one of: an equalizer; a sampling module; a noise shaper; a pulse width modulator; and an analog output module.

The details of one or more implementations are set forth in the accompanying drawings and the description below. Other features will be apparent from the description and drawings, and from the claims.

Figure 1:
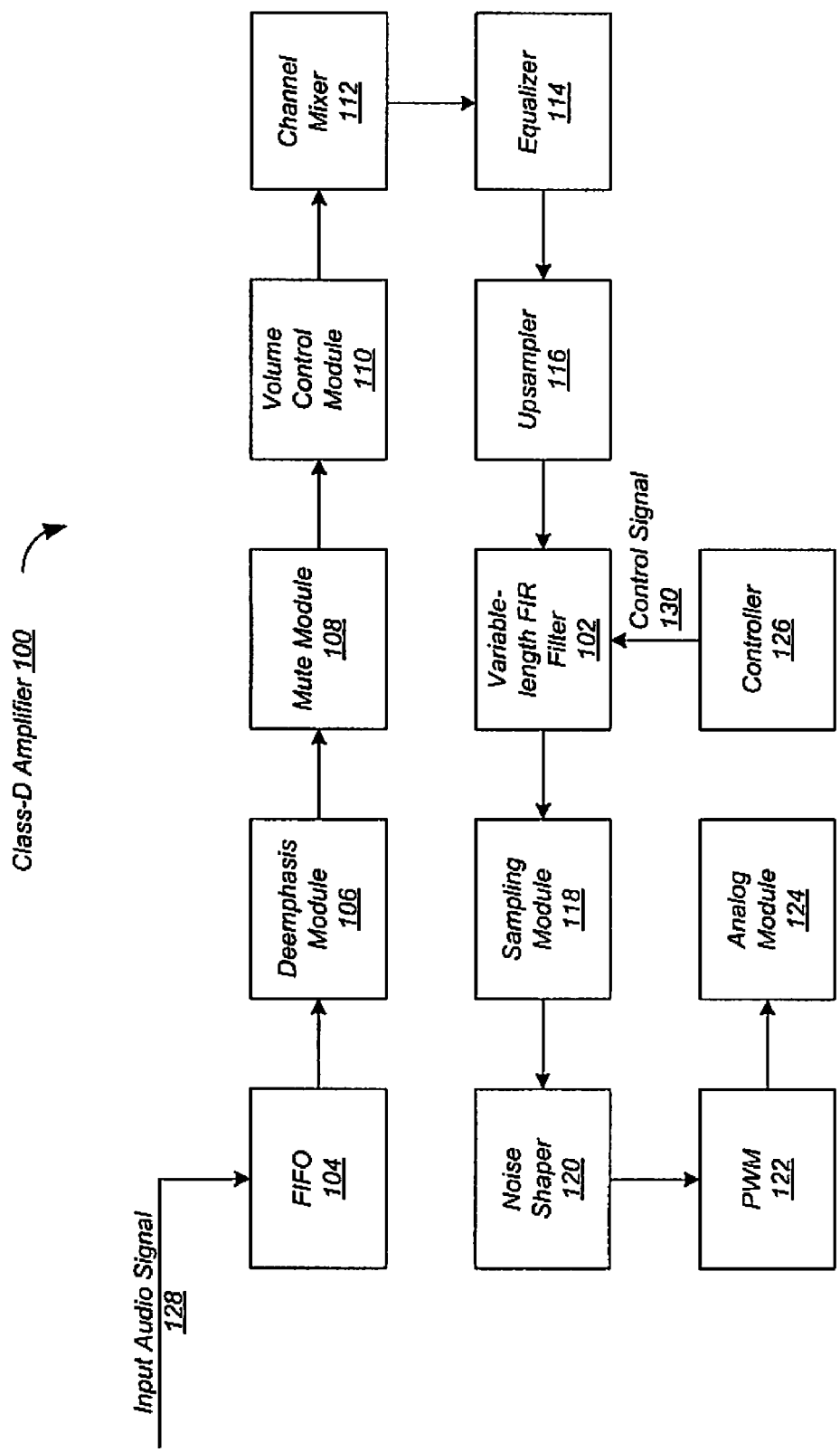
FIG. 1 shows a class-D amplifier including a variable-length FIR filter according to an embodiment of the present invention.

The leading digit(s) or each reference numeral used in this specification indicates the number of the drawing in which the reference numeral first appears.

DETAILED DESCRIPTION

Embodiments of the present invention provide multimode audio amplifiers. Each multimode audio amplifier includes at least one multimode module. Each multimode module has a plurality of operating modes. The operating modes are selected in accordance with a control signal. Changing operating modes results in a measurable change in at least one characteristic of the multimode audio amplifier. Those characteristics can include signal to noise ratio (SNR); total harmonic distortion and noise (THD+N); input to output delay; power consumption; and efficiency. The control signal can be based on a characteristic of an input signal for the amplifier, a battery level of a battery providing power to the amplifier, and the like.

Embodiments of the present invention also provide variable-length finite impulse response (FIR) filters. The length of the variable-length FIR filter can be selected in accordance with the control signal provided by a filter controller. The filter controller can provide the control signal based on a characteristic of an input signal processed by the variable-length FIR filter, a battery level of a battery providing power to the variable-length FIR filter, and the like. The characteristic of the input signal can include a type of the input signal, a bandwidth of the input signal, and the like. The type of the input signal can include voice, music, and the like. The variable-length FIR filters can be employed in the multimode audio amplifiers disclosed herein.

FIG. 1 shows a class-D amplifier 100 according to an embodiment of the present invention. Although in the described embodiments, the elements of class-D amplifier 100 are presented in one arrangement, other embodiments may feature other arrangements, as will be apparent to one skilled in the relevant arts based on the disclosure and teachings provided herein. For example, the elements of class-D amplifier 100 can be implemented in hardware, software, or combinations thereof.

Referring to FIG. 1, class-D amplifier 100 includes a first-in first-out (FIFO) buffer 104, a deemphasis module 106, a mute module 108, a volume control module 110, a channel mixer 112, an equalizer 114, an upsampler 116, FIR filter 102, a sampling module 118, a noise shaper 120, a pulse-width modulator (PWM) 122, an analog output module 124, and a controller 126. Class-D amplifier 100 can be used to amplify an input audio signal 128.

Figure 2:
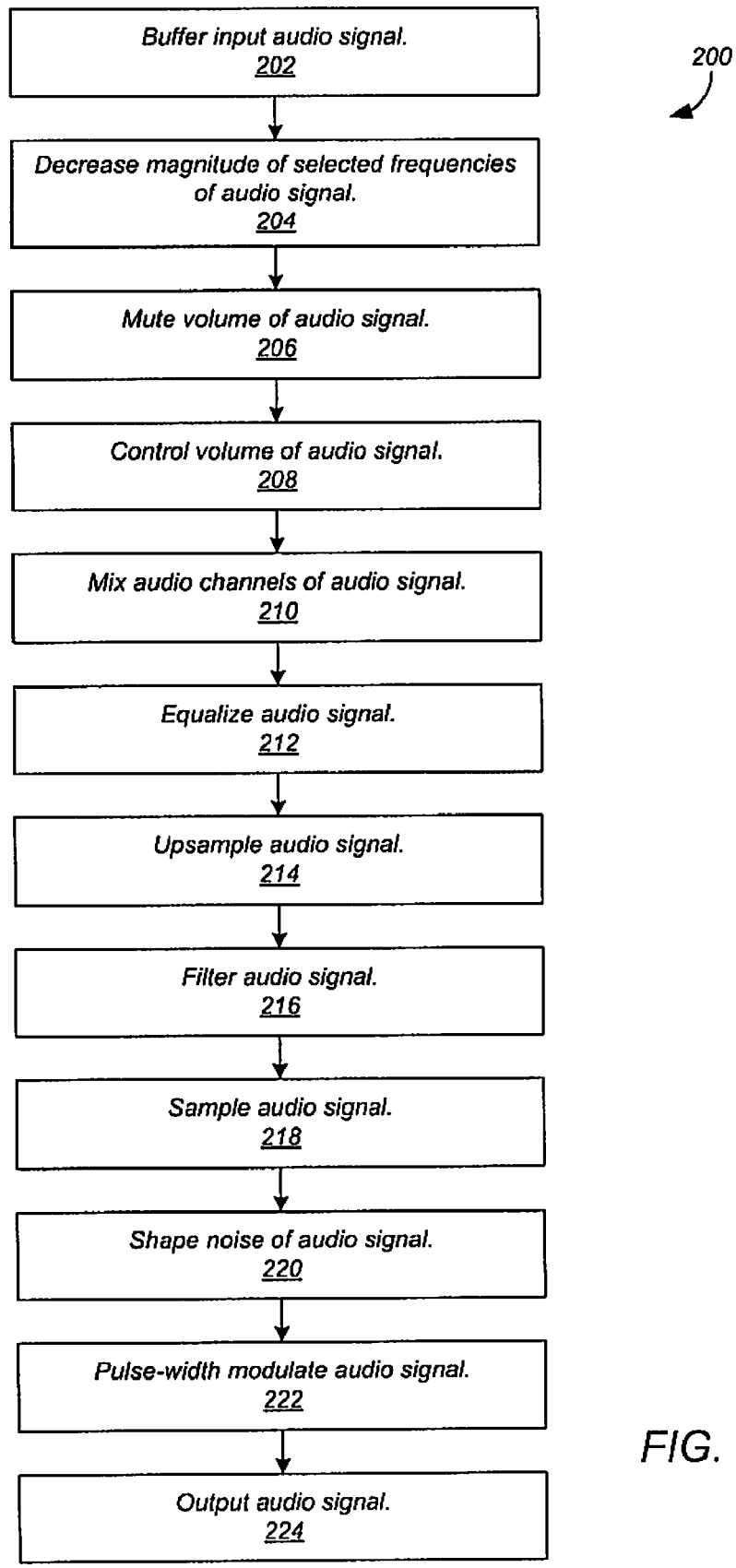
FIG. 2 shows a process for the class-D amplifier of FIG. 1 according to an embodiment of the present invention.

FIG. 2 shows a process 200 for class-D amplifier 100 of FIG. 1 according to an embodiment of the present invention. Although in the described embodiments, the elements of process 200 are presented in one arrangement, other embodiments may feature other arrangements, as will be apparent to one skilled in the relevant arts based on the disclosure and teachings provided herein. For example, in various embodiments, some or all of the steps of process 200 can be executed in a different order, concurrently, and the like. As another example, while class-D amplifier 100 is described in terms of amplifying an input audio signal 128, class-D amplifier 100 can also be used to amplify other sorts of signals.

Referring to FIG. 2, FIFO buffer 104 buffers input audio signal 128 (step 202). Input audio signal 128 can be analog or digital. Deemphasis module 106 can be used to improve the signal-to-noise ratio of the audio signal by decreasing the magnitude of selected frequencies (step 204). Mute module 108 can be used to mute the volume of the audio signal (step 206). Volume control module 110 can be used to control the volume of the audio signal (step 208). Channel mixer 112 can be used to mix the left and right audio channels of the audio signal, for example when the audio signal represents voice (step 210). Equalizer 114 can be used to equalize the audio signal (step 212).

Upsampler 116 upsamples the audio signal (step 214). For example, upsampler 116 can implement 2× upsampling by inserting a zero between each pair of samples of the audio signal. FIR filter 102 filters the upsampled signal (step 216). FIR filter 102 can be implemented as a low-pass filter. FIR filter 102 can be implemented as any of the variable-length FIR filters described below.

Sampling module 118 can be used to resample, natural sample, and spread-spectrum sample the audio signal (step 218). Noise shaper 120 can be used to shape the noise of the audio signal (step 220). PWM 122 can be used to pulse-width modulate the audio signal (step 222). Analog output module 124 can be used to output the audio signal to a speaker, headphones, and the like (step 224).

Different applications may have different requirements for audio amplifiers. For example, playing MP3 music may require an amplifier with a high signal to noise ratio (SNR) of 100 dB or more, whereas amplifying the human voice for telephone conversation requires an SNR of only 80 dB or less. Some devices, such as mobile phones, may be used for both music playback and voice conversation. Embodiments disclosed herein provide a multimode amplifier that can satisfy different requirements with a single amplifier.

In some embodiments, one or more other modules within amplifier 100 can be implemented as a multimode module having a plurality of operating modes which are selected in accordance with control signal 130 provided by controller 126. For example, equalizer 114 can be disabled when audio signal 128 represents voice, and enabled when audio signal 128 represents music. As another example, the precision of sampling module 118 can be reduced for low-bandwidth audio signals 128, for example by reducing the frequency of a sampling sawtooth wave employed in spread-spectrum sampling. As another example, the order of a filter used by noise shaper 120 can be selected according to control signal 130. As another example, the bit precision of pulse-width modulator (PWM) 122 can be selected according to control signal 130. As another example, the topology of analog Output module 124 can be selected according to control signal 130. Changing the operating modes of the multimode module results in a measurable change in at least one characteristic of amplifier 100. Those characteristics can include, for example, signal to noise ratio (SNR); total harmonic distortion and noise (THD+N); input to output delay; power consumption; and efficiency.

In some embodiments, the multimode amplifier includes a variable-length FIR filter. FIR filter 102 has a plurality of lengths, which are selected according to a control signal 130 provided by controller 126. Controller 126 can select the length of filter 102 according to a bandwidth of audio signal 128. For example, when audio signal 128 represents 8 kHz voice, controller 126 can select a relatively short filter length, and when audio signal 128 represents 44.1 kHz CD audio, controller 126 can select a relatively long filter length.

Figure 3:
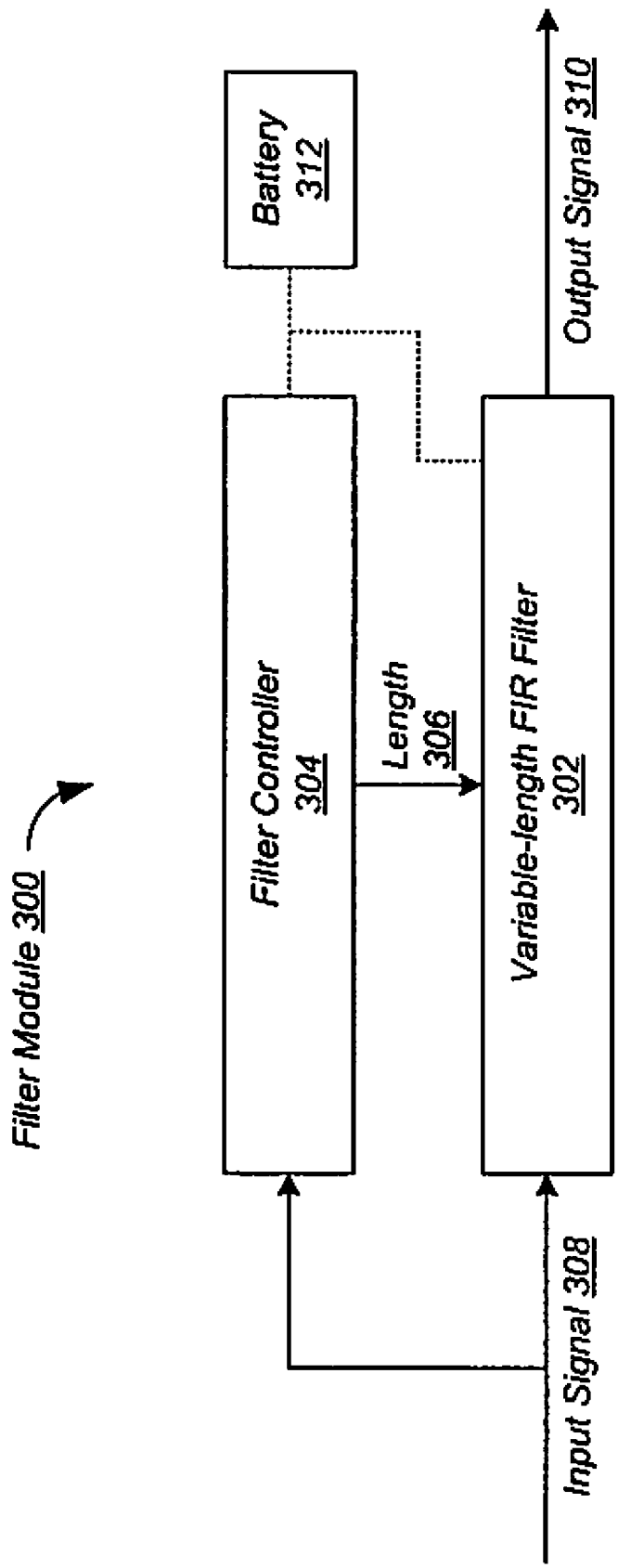
FIG. 3 shows a filter module according to an embodiment of the present invention.

FIG. 3 shows a filter module 300 according to an embodiment of the present invention. Although in the described embodiments, the elements of filter module 300 are presented in one arrangement, other embodiments may feature other arrangements, as will be apparent to one skilled in the relevant arts based on the disclosure and teachings provided herein. For example, the elements of filter module 300 can be implemented in hardware, software, or combinations thereof.

Referring to FIG. 3, filter module 300 includes a variable-length FIR filter 302 and a filter controller 304. Filter controller 304 provides a control signal 306. Variable-length FIR filter 302 provides an output signal 310 based on an input signal 308. The length of variable-length FIR filter 302 is selected in accordance with control signal 306. The length of variable-length FIR filter 302 represents the order of the variable-length FIR filter 302, the number of taps of variable-length FIR filter 302, or both.

Filter module 300 can provide control signal 306 based on information such as a characteristic of input signal 308, a battery level of a battery 312 providing power to variable-length FIR filter 302, and the like. The characteristic of input signal 308 can include a type of input signal 308, a bandwidth of input signal 308, and the like. The type of input signal 308 can include voice, music, and the like.

Figure 4:
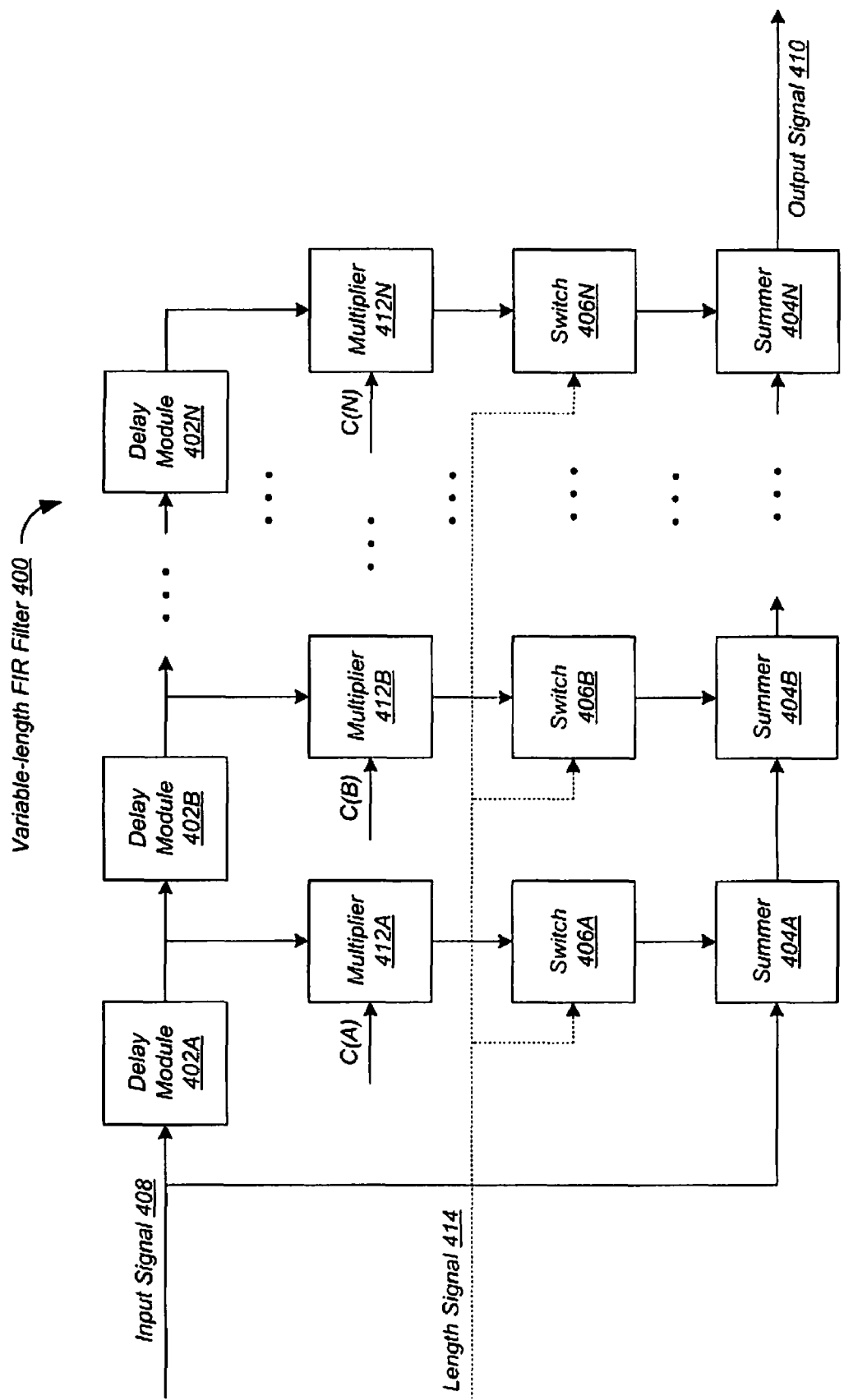
FIG. 4 shows a variable-length FIR filter according to an embodiment of the present invention.

FIG. 4 shows a variable-length FIR filter 400 according to an embodiment of the present invention. Although in the described embodiments, the elements of variable-length FIR filter 400 are presented in one arrangement, other embodiments may feature other arrangements, as will be apparent to one skilled in the relevant arts based on the disclosure and teachings provided herein. For example, the elements of variable-length FIR filter 400 can be implemented in hardware, software, or combinations thereof. Variable-length FIR filter 400 can be used to implement variable-length FIR filter 302 of FIG. 3.

Referring to FIG. 4, variable-length FIR filter 400 includes N delay modules 402A-N, N summers 404A-N, and N switches 406A-N. Delay module 402A receives an input signal 408. Each of the remaining delay modules 402B-N receives the output of the previous delay module 402. Each delay module 402 delays its input signal by a fixed delay.

In some embodiments, variable-length FIR filter 400 includes N multipliers 412A-N. Each multiplier 412 multiplies the output of a corresponding delay module 402 by a respective coefficient C(A N). Each switch 406 couples one of summers 404 with the corresponding multiplier 412 in accordance with a control signal 414.

Summer 404A receives input signal 408, and outputs the sum of input signal 408 and the output of multiplier 412A. Each of the remaining summers 404B-N outputs the sum of the output of the previous summer 404 and the output of the corresponding multiplier 412.

Control signal 414 can be provided by controller 304 of FIG. 3, and can be implemented as a vector transmitted over a plurality of control lines each controlling one of switches 406. Control signal 414 changes the length of variable-length FIR filter 400 by opening or closing one or more of switches 406, thereby changing the order of filter 400, the number of taps of filter 400, or both.

Figure 5:
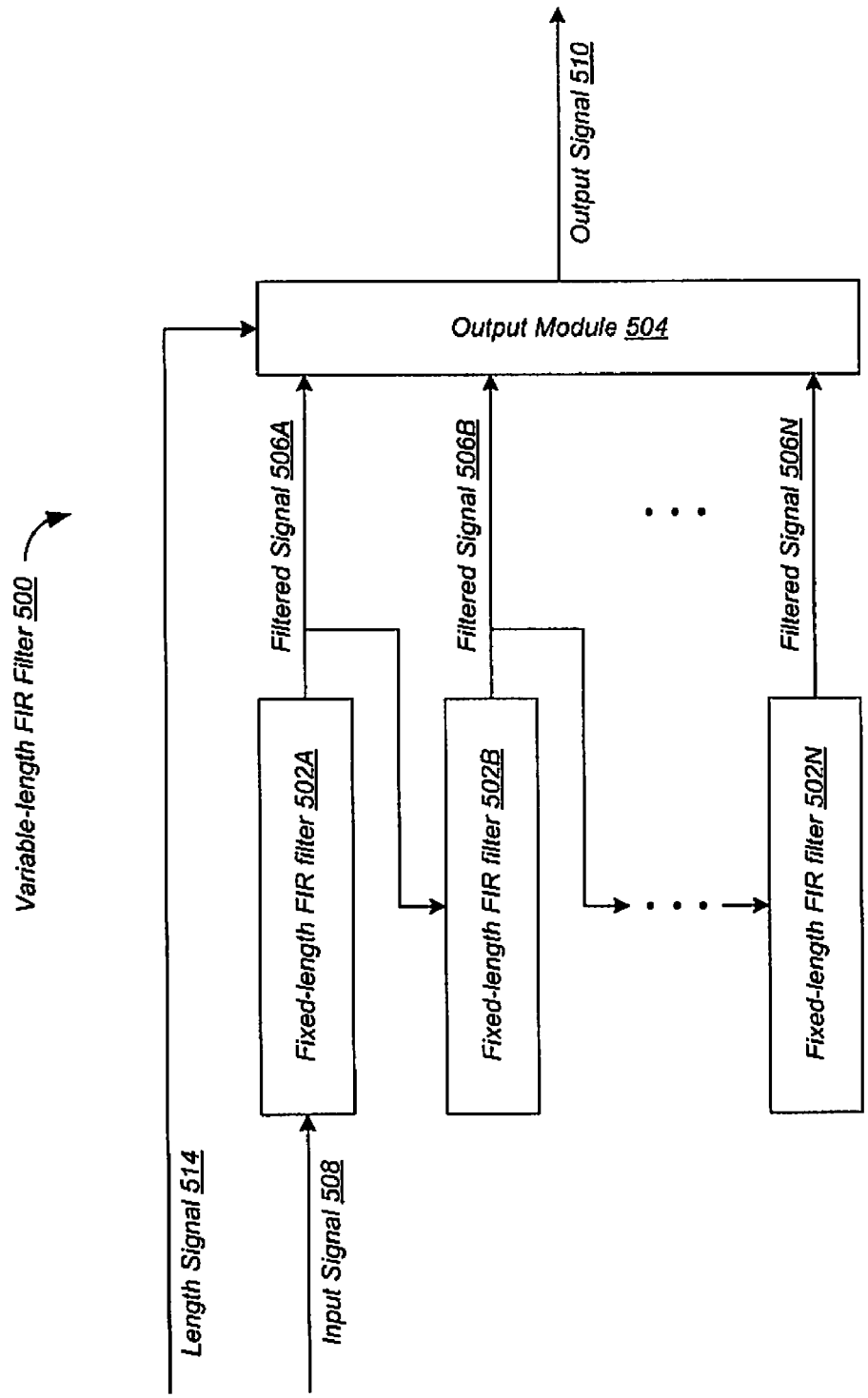
FIG. 5 shows a variable-length FIR filter including a plurality of fixed-length FIR filters connected in series according to an embodiment of the present invention.

FIG. 5 shows a variable-length FIR filter 500 including a plurality of fixed-length FIR filters connected in series according to an embodiment of the present invention. Although in the described embodiments, the elements of variable-length FIR filter 500 are presented in one arrangement, other embodiments may feature other arrangements, as will be apparent to one skilled in the relevant arts based on the disclosure and teachings provided herein. For example, the elements of variable-length FIR filter 500 can be implemented in hardware, software, or combinations thereof. Variable-length FIR filter 500 can be used to implement variable-length FIR filter 302 of FIG. 3.

Referring to FIG. 5, variable-length FIR filter 500 includes N fixed-length FIR filters 502A-N and an output module 504. Fixed-length FIR filters 502 can be implemented as conventional FIR filters. Fixed-length FIR filters 502 can have the same lengths or different lengths.

Fixed-length FIR filter 502A receives an input signal 508, and provides a filtered signal 506A based on input signal input signal 508. Each of the remaining fixed-length FIR filters 502B-N receives the filtered signal 506 output by the previous fixed-length FIR filter 502. Output module 504 provides one of filtered signals 506B-N as an output signal 510 in accordance with a control signal 514. Control signal 514 can be provided by a controller such as controller 304 of FIG. 3.

Control signal 514 changes the length of variable-length FIR filter 500 through selection of one of filtered signals 506 to be provided as output signal 510. For example, consider a case where N=2, fixed-length FIR filter 502A has a length of 2, and fixed-length FIR filter 502N has a length of 3. In this example, output module 504 can set the length of variable-length FIR filter 500 to 2 or 5 by providing filtered signal 506A or 506N, respectively, as output signal 510.

Figure 6:
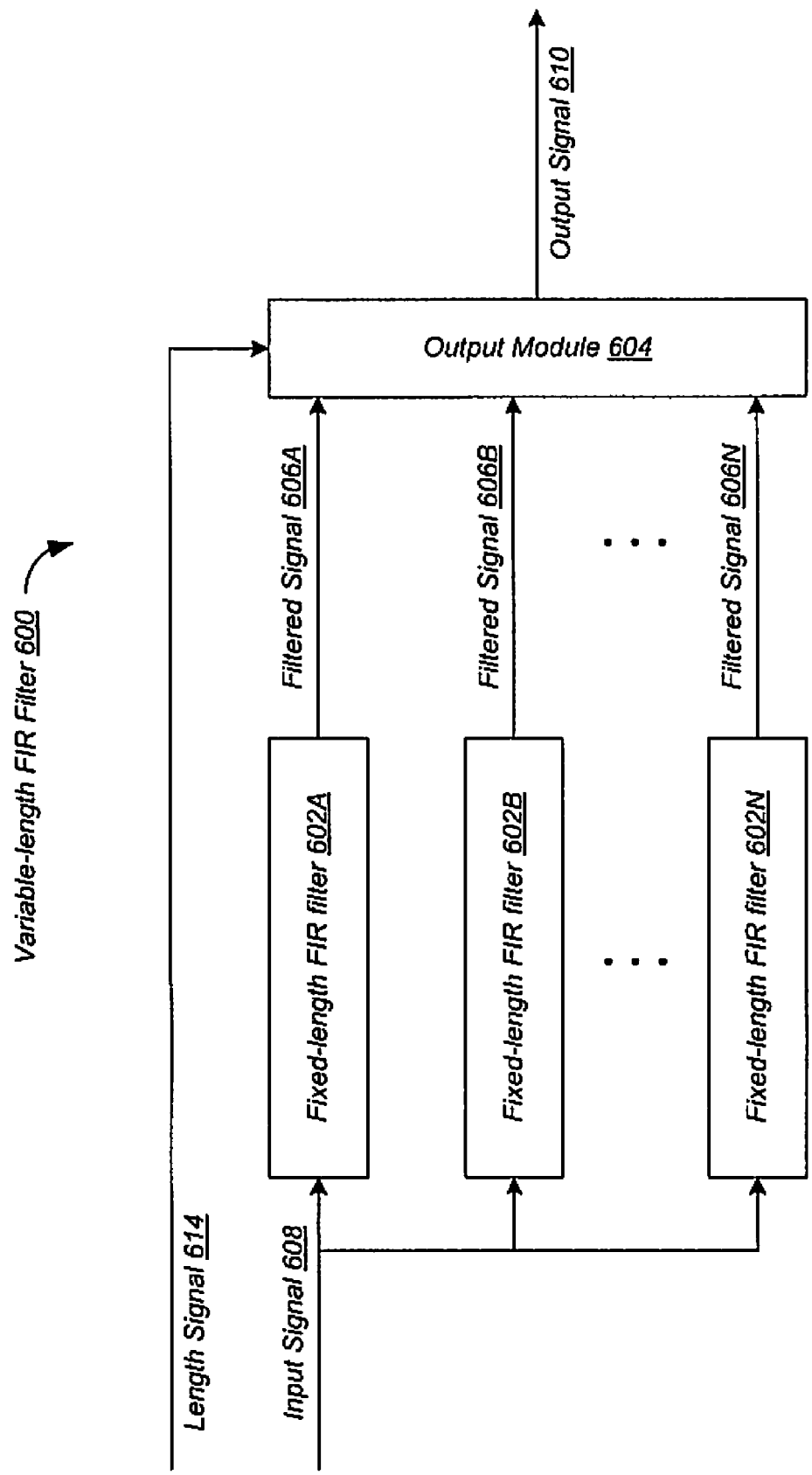
FIG. 6 shows a variable-length FIR filter including a plurality of fixed-length FIR filters connected in parallel according to an embodiment of the present invention.

FIG. 6 shows a variable-length FIR filter 600 including a plurality of fixed-length FIR filters connected in parallel according to an embodiment of the present invention. Although in the described embodiments, the elements of variable-length FIR filter 600 are presented in one arrangement, other embodiments may feature other arrangements, as will be apparent to one skilled in the relevant arts based on the disclosure and teachings provided herein. For example, the elements of variable-length FIR filter 600 can be implemented in hardware, software, or combinations thereof. Variable-length FIR filter 600 can be used to implement variable-length FIR filter 302 of FIG. 3.

Referring to FIG. 6, variable-length FIR filter 600 includes N fixed-length FIR filters 602A-N and an output module 604. Fixed-length FIR filters 602 can be implemented as conventional FIR filters. Each fixed-length FIR filter 602 has a different length.

Each fixed-length FIR filter 602A-N receives an input signal 608, and provides a respective filtered signal 606A-N based on input signal input signal 608. Output module 604 provides one of filtered signals 606B-N as an output signal 610 in accordance with a control signal 614. Control signal 614 can be provided by a controller such as controller 304 of FIG. 3.

Control signal 614 changes the length of variable-length FIR filter 600 through selection of one of filtered signals 606 to be provided as output signal 610. For example, consider a case where N=2, fixed-length FIR filter 602A has a length of 2, and fixed-length FIR filter 602N has a length of 4. In this example, output module 604 can set the length of variable-length FIR filter 600 to 2 or 4 by providing filtered signal 606A or 606N, respectively, as output signal 610.

Figure 7:
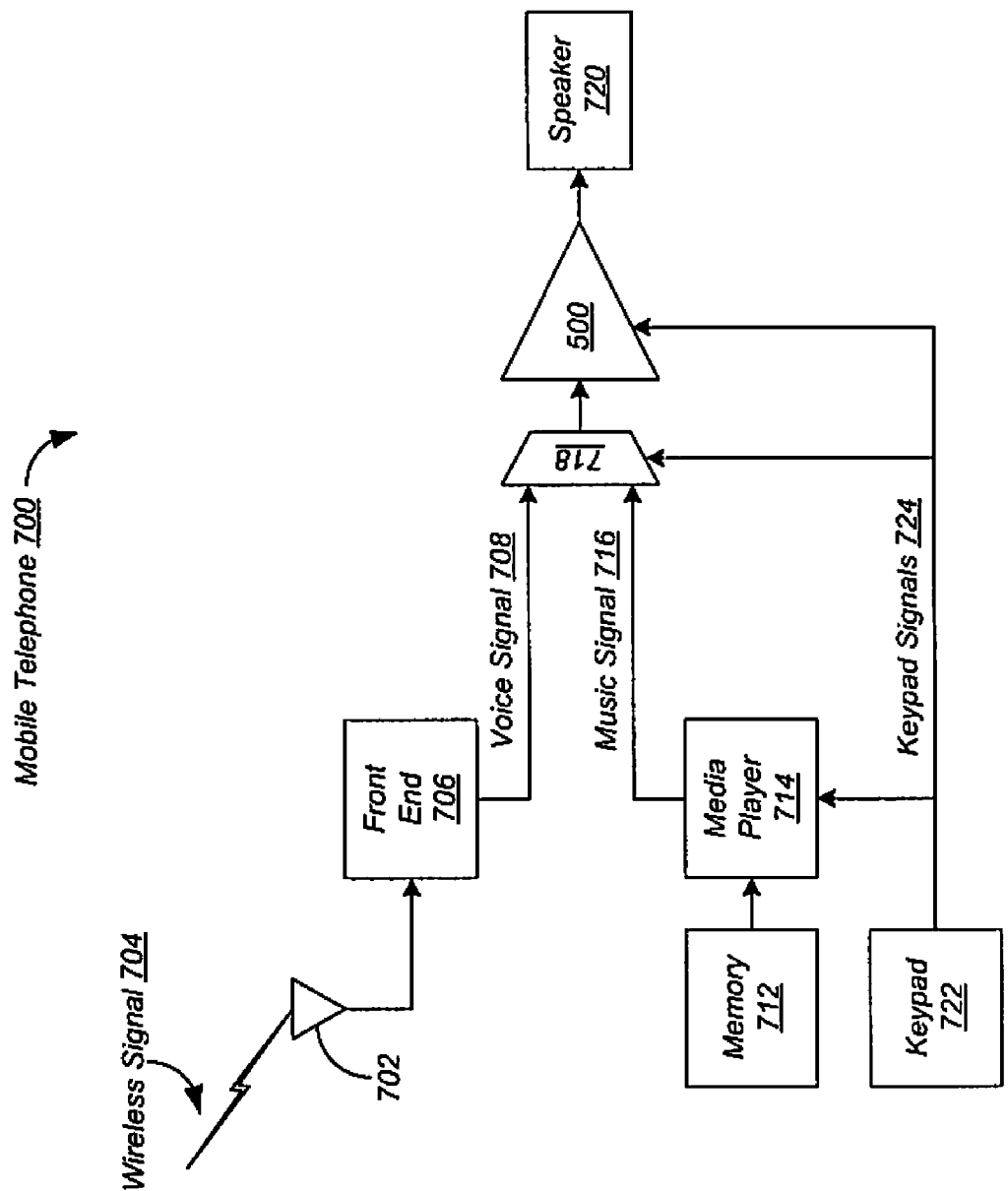
FIG. 7 shows a mobile telephone including the class-D amplifier of FIG. 5 according to one embodiment.

Class-D amplifier 500 can be implemented in a portable device such as a mobile telephone and the like. For example, FIG. 7 shows a mobile telephone 700 including class-D amplifier 500 of FIG. 5 according to one embodiment. Although in the described embodiments, the elements of mobile telephone 700 are presented in one arrangement, other embodiments may feature other arrangements, as will be apparent to one skilled in the relevant arts based on the disclosure and teachings provided herein. For example, the elements of mobile telephone 700 can be implemented in hardware, software, or combinations thereof.

Referring to FIG. 7, mobile telephone 700 includes class-D amplifier 500, an antenna 702, a front end 706, a memory 712, a media player 714, an audio switch 718, a speaker 720, and a keypad 722. Of course, mobile telephone 700 can include other elements such as a microphone, a display, and the like, but for clarity, these elements are not shown in FIG. 7.

Figure 8:
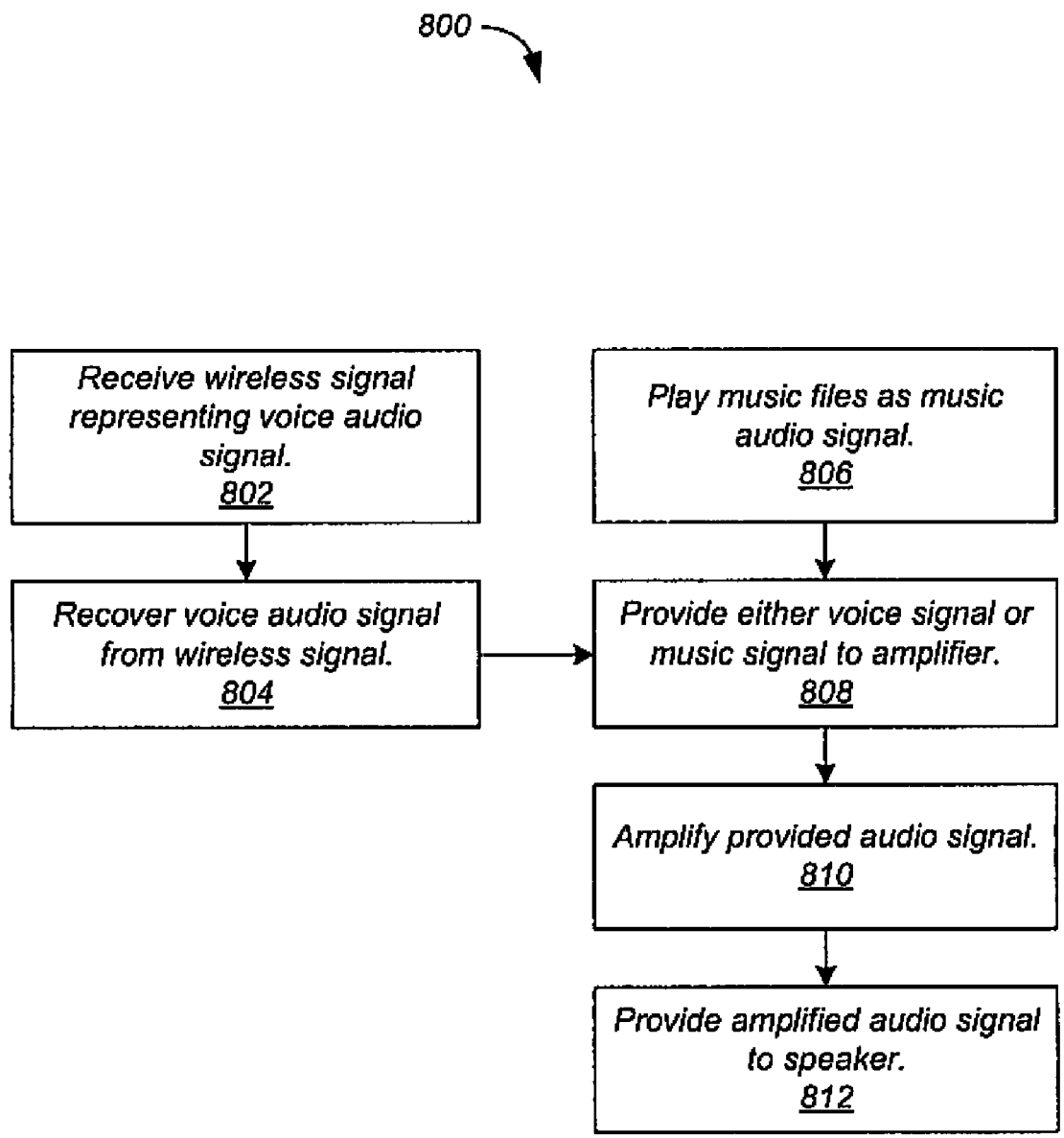
FIG. 8 shows a process for the mobile telephone of FIG. 7 according to an embodiment of the present invention.

FIG. 8 shows a process 800 for mobile telephone 700 of FIG. 7 according to an embodiment of the present invention. Although in the described embodiments, the elements of process 800 are presented in one arrangement, other embodiments may feature other arrangements, as will be apparent to one skilled in the relevant arts based on the disclosure and teachings provided herein. For example, in various embodiments, some or all of the steps of process 800 can be executed in a different order, concurrently, and the like.

Referring to FIG. 8, antenna 702 receives a wireless signal 704 representing a voice audio signal 708 (step 802). Front end 706 recovers voice audio signal 708 from wireless signal 704 (step 804). Memory 712 stores one or more music files. Media player 714 plays the music files as a music audio signal 716 (step 806). Audio switch 718 provides either voice signal 708 or music signal 716 to amplifier 500 (step 808). Switch 718 can operate according to keypad signals 724 generated by keypad 722.

Amplifier 500 amplifies the signal provided by audio switch 718 (step 810). Referring again to FIG. 5, controller 526 selects the length of variable-length FIR filter 502. Controller 526 can select the filter length based on keypad signals 724, by detecting the bandwidth of the audio signal, and the like. When amplifier 500 includes other multimode modules, controller 526 can also select the operating modes of the multimode modules as well. Referring again to FIG. 8, amplifier 500 provides the amplified audio signal to speaker 720 (step 812).

Embodiments of the invention can be implemented in digital electronic circuitry, or in computer hardware, firmware, software, or in combinations of them. Apparatus of the invention can be implemented in a computer program product tangibly embodied in a machine-readable storage device for execution by a programmable processor; and method steps of the invention can be performed by a programmable processor executing a program of instructions to perform functions of the invention by operating on input data and generating output. The invention can be implemented advantageously in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors. Generally, a processor will receive instructions and data from a read-only memory and/or a random access memory. Generally, a computer will include one or more mass storage devices for storing data files; such devices include magnetic disks, such as internal hard disks and removable disks; magneto-optical disks; and optical disks. Storage devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs (application-specific integrated circuits).

A number of implementations of the invention have been described. Nevertheless, it will be understood that various modifications may be made without departing from the spirit and scope of the invention. Accordingly, other implementations are within the scope of the following claims.

What is claimed is:

1. A multimode audio amplifier comprising:
a mode controller configured to provide a control signal;
at least one multimode module, wherein each of the multimode modules is configured to operate in one of a plurality of operating modes, wherein the operating modes are selected in response to the control signal, wherein changing the operating modes results in a measurable change in at least one characteristic of the multimode audio amplifier, and wherein the characteristics of the multimode audio amplifier include
signal to noise ratio (SNR),
total harmonic distortion and noise (THD+N),
input to output delay,
power consumption, and
efficiency; and
a variable-length finite impulse response (FIR) filter configured to provide an output signal based on an input signal, wherein a length of the variable-length FIR filter is selected in response to the control signal, wherein the length of the variable-length FIR filter represents at least one of
an order of the variable-length FIR filter, and
a number of taps of the variable-length FIR filter, and wherein the variable-length FIR filter comprises
a first fixed-length FIR filter configured to provide a first filtered signal based on the input signal,
a second fixed-length FIR filter configured to provide a second filtered signal based on the first filtered signal, and
an output module configured to provide one of the first filtered signal and the second filtered signal as the output signal in response to the control signal.

2. The amplifier of claim 1, wherein the at least one multimode module includes at least one of:
an equalizer;
a sampling module;
a noise shaper;
a pulse width modulator; and
an analog output module.

3. A portable device comprising the amplifier of claim 1.

4. A mobile telephone comprising the amplifier of claim 1.

5. A multimode audio amplifier comprising:
means for providing a control signal;
at least one multimode means for operating in a plurality of modes, wherein each of the multimode means operates in one of the plurality of the modes, wherein the modes are selected in response to the control signal, wherein changing the modes results in a measurable change in at least one characteristic of the multimode audio amplifier, and wherein the characteristics of the multimode audio amplifier include
signal to noise ratio (SNR),
total harmonic distortion and noise (THD+N),
input to output delay,
power consumption, and
efficiency; and
filter means for providing an output signal based on an input signal, wherein a length of the filter means is selected in response to the control signal, wherein the length of the filter means represents at least one of
an order of the filter means, and
a number of taps of the filter means, and
wherein the filter means comprises
first filter means for providing a first filtered signal based on the input signal,
second filter means for providing a second filtered signal based on the first filtered signal, and
output means for providing one of the first filtered signal and the second filtered signal as the output signal in response to the control signal.

6. The amplifier of claim 5, wherein the at least one multimode means includes at least one of:
an equalizer;
a sampling module;
a noise shaper;
a pulse width modulator; and
an analog output module.

7. A portable device comprising the amplifier of claim 5.

8. A mobile telephone comprising the amplifier of claim 5.

9. An apparatus comprising:
a filter controller configured to provide a control signal; and
a variable-length finite impulse response (FIR) filter configured to provide an output signal based on an input signal, wherein a length of the variable-length FIR filter is selected in response to the control signal, wherein the length of the variable-length FIR filter represents at least one of
an order of the variable-length FIR filter, and
a number of taps of the variable-length FIR filter, and
wherein the variable-length FIR filter comprises
a first fixed-length FIR filter configured to provide a first filtered signal based on the input signal,
a second fixed-length FIR filter configured to provide a second filtered signal based on the first filtered signal, and
an output module configured to provide one of the first filtered signal and the second filtered signal the output signal in response to the control signal.

10. The apparatus of claim 9:
wherein the filter controller provides the control signal based on at least one of
a characteristic of the input signal, and
a battery level of a battery providing power to the variable-length FIR filter.

11. The apparatus of claim 10, wherein the characteristic of the input signal comprises at least one of:
a type of the input signal; and
a bandwidth of the input signal.

12. The apparatus of claim 11, wherein the type of the input signal comprises at least one of:
voice; and
music.

13. An amplifier comprising the apparatus of claim 9.

14. The amplifier of claim 13, further comprising:
at least one multimode module, wherein each of the multimode modules has a plurality of operating modes, and wherein the operating modes are selected in response to the control signal.

15. The amplifier of claim 14, wherein the at least one multimode module includes at least one of:
an equalizer;
a sampling module;
a noise shaper;
a pulse width modulator; and
an analog output module.

16. A portable device comprising the amplifier of claim 13.

17. A mobile telephone comprising the amplifier of claim 13.

18. An apparatus comprising:
filter controller means for providing a control signal; and
filter means for providing an output signal based on an input signal, wherein a length of the filter means is selected in response to the control signal, wherein the length of the filter means represents at least one of
an order of the filter means, and
a number of taps of the filter means, and
wherein the filter means comprises
first filter means for providing a first filtered signal based on the input signal,
second filter means for providing a second filtered signal based on the first filtered signal, and
output means for providing one of the first filtered signal and the second filtered signal as the output signal in response to the control signal.

19. The apparatus of claim 18, wherein the filter controller means provides the control signal based on at least one of
a characteristic of the input signal, and
a battery level of a battery providing power to the filter means.

20. The apparatus of claim 19, wherein the characteristic of the input signal comprises at least one of:
a type of the input signal; and
a bandwidth of the input signal.

21. The apparatus of claim 20, wherein the type of the input signal comprises at least one of:
voice; and
music.

22. An amplifier comprising the apparatus of claim 18.

23. The amplifier of claim 22, further comprising:
at least one multimode means for operating in a plurality of modes, wherein each of the multimode means has a plurality of operating modes, wherein the operating modes are selected in response to the control signal, wherein changing the operating modes results in a measurable change in at least one characteristic of the amplifier.

24. The amplifier of claim 23, wherein the at least one multimode means includes at least one of:
means for equalizing;
means for sampling;
means for shaping noise;
means for pulse width modulating; and
means for analog outputting.

25. A portable device comprising the amplifier of claim 22.

26. A mobile telephone comprising the amplifier of claim 22.

* * * * *